United States Patent
Andres

(10) Patent No.: US 9,527,593 B2
(45) Date of Patent: Dec. 27, 2016

(54) THERMAL ACCUMULATOR AND METHOD OF USE

(75) Inventor: Michael J. Andres, Roscoe, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 1215 days.

(21) Appl. No.: 13/081,644

(22) Filed: Apr. 7, 2011

(65) Prior Publication Data

US 2012/0255711 A1  Oct. 11, 2012

(51) Int. Cl.
| | |
|---|---|
| F25B 7/00 | (2006.01) |
| F25D 17/06 | (2006.01) |
| F25D 17/04 | (2006.01) |
| B64D 13/06 | (2006.01) |
| H05K 7/20 | (2006.01) |
| F25B 19/02 | (2006.01) |
| F25B 1/06 | (2006.01) |
| F25B 1/08 | (2006.01) |

(Continued)

(52) U.S. Cl.
CPC ........... *B64D 13/06* (2013.01); *H05K 7/20354* (2013.01); *B64D 2013/0614* (2013.01); *B64D 2013/0674* (2013.01); *F25B 1/053* (2013.01); *F25B 1/06* (2013.01); *F25B 1/08* (2013.01); *F25B 9/065* (2013.01); *F25B 19/02* (2013.01); *F25B 2341/001* (2013.01); *F25B 2345/001* (2013.01); *F25B 2345/002* (2013.01); *F25B 2345/003* (2013.01); *F25B 2345/004* (2013.01); *Y02T 50/56* (2013.01)

(58) Field of Classification Search
USPC ...................................... 62/79, 407–411, 427
See application file for complete search history.

(56) References Cited

U.S. PATENT DOCUMENTS

| | | | | |
|---|---|---|---|---|
| 2,925,722 A | * | 2/1960 | Blackburn | B64D 13/08 165/80.4 |
| 3,650,636 A | * | 3/1972 | Eskeli | F04D 17/18 415/1 |

(Continued)

FOREIGN PATENT DOCUMENTS

| | | |
|---|---|---|
| WO | WO0216743 A1 | 2/2002 |
| WO | WO2012126711 A1 | 9/2012 |

OTHER PUBLICATIONS

Extended European Search Report, European Application No. 12161627.0, dated Nov. 10, 2015, 7 pages.

*Primary Examiner* — Frantz Jules
*Assistant Examiner* — Steve Tanenbau
(74) *Attorney, Agent, or Firm* — Kinney & Lange, P.A.

(57) ABSTRACT

A thermal management system for a vehicle includes a tank, a heat exchanger, a pump, and a valve located on a conduit. The heat exchanger is located downstream of the tank, the pump is located between the tank and the heat exchanger, and the valve is located downstream of the heat exchanger. The heat exchanger places the coolant in a heat exchange relationship with a heat load from the vehicle such that the coolant vaporizes. The valve regulates pressure within the heat exchanger and controls exhaustion of the vaporized coolant from the vehicle. Water, used as a coolant, can be replenished in flight by condensing a portion of the heat exchanger exhaust or condensing water as part of the environmental control system function or by condensing a portion of the engine exhaust.

12 Claims, 4 Drawing Sheets

(51) Int. Cl.
   *F25B 1/053* (2006.01)
   *F25B 9/06* (2006.01)

(56) References Cited

U.S. PATENT DOCUMENTS

| | | | | |
|---|---|---|---|---|
| 3,664,145 | A * | 5/1972 | Johnson | C02F 1/22 |
| | | | | 62/123 |
| 3,680,327 | A | 8/1972 | Stein | |
| 3,989,103 | A | 11/1976 | Cieszko et al. | |
| 4,603,732 | A | 8/1986 | Niggemann | |
| 5,127,232 | A * | 7/1992 | Paige | F25B 45/00 |
| | | | | 62/149 |
| 5,209,078 | A * | 5/1993 | Conrad | B60H 1/3202 |
| | | | | 137/62 |
| 5,277,032 | A * | 1/1994 | See | F25B 45/00 |
| | | | | 62/125 |
| 5,398,519 | A * | 3/1995 | Weber | H05K 7/20381 |
| | | | | 165/41 |
| 5,507,150 | A * | 4/1996 | Weber | B64D 13/00 |
| | | | | 62/100 |
| 5,638,689 | A * | 6/1997 | Scaringe et al. | 62/77 |
| 6,939,392 | B2 | 9/2005 | Huang et al. | |
| 7,384,454 | B2 * | 6/2008 | Tongue | B01D 53/261 |
| | | | | 95/114 |
| 2005/0083654 | A1 * | 4/2005 | Tsoi | F25B 1/06 |
| | | | | 361/699 |
| 2009/0249808 | A1 | 10/2009 | Ullman et al. | |

* cited by examiner

THERMAL ACCUMULATOR AND METHOD OF USE

BACKGROUND

The present disclosure relates generally to thermal management, and more particularly to thermal management for electronic systems aboard vehicles.

Thermal Management Systems (TMS) and Environmental Control Systems (ECS) for aircrafts are commonly sized for the worst case coincident design conditions of thermal load, heat sink temperature and availability, and power availability. Mission segments that may result in an unbalance between the load, heat sink and power include hot day ground operation at engine idle, hot day low altitude high speed dash, and high altitude top of descent. Depending on aircraft requirements and system architectures, the TMS and/or ECS may operate at significantly less than design capacity during the majority of the mission. This results in larger and heavier systems than would be required if the TMS and/or ECS were sized for mission average conditions.

In aircrafts, thermal loads are becoming increasing less steady-state and de-coupled from available power. One trend is the replacement of hydraulic flight controls with electronic flight controls. Thermal loads from electronic flight controls will peak on approach to landing when engine power settings and speed are reduced. Radar and other thermal loads from electronic systems may be high at any one part of the flight, regardless of engine power setting.

SUMMARY

A thermal management system for a vehicle includes a tank, a heat exchanger, a pump, and a first valve. The tank is located onboard the vehicle and stores coolant. The heat exchanger is located downstream of the tank on a first conduit. The heat exchanger places the coolant in a heat exchange relationship with a heat load from the vehicle such that the coolant vaporizes. The pump, which is located between the tank and the heat exchanger on the first conduit, pumps the coolant from the tank to the heat exchanger. The first valve, which is located downstream of the heat exchanger on the first conduit, regulates pressure within the heat exchanger and controls exhaustion of the vaporized coolant from the vehicle.

In one embodiment of the thermal management system, the vehicle is an aircraft, the coolant is water, the heat exchanger is a boiler, and the valve is a backpressure valve. Within the boiler, a heat load from an electronics system vaporizes the water into steam. The backpressure valve regulates pressure within the boiler and controls exhaustion of the steam from the aircraft.

A method for managing heat for an electronics system onboard an aircraft includes storing a liquid coolant on the aircraft, and pumping the liquid coolant to a heat exchanger. The method further includes vaporizing the liquid coolant into a gas coolant in the heat exchanger by absorbing a heat load from the electronics system, and exhausting the gas coolant from the aircraft.

DETAILED DESCRIPTION

Figure 1:
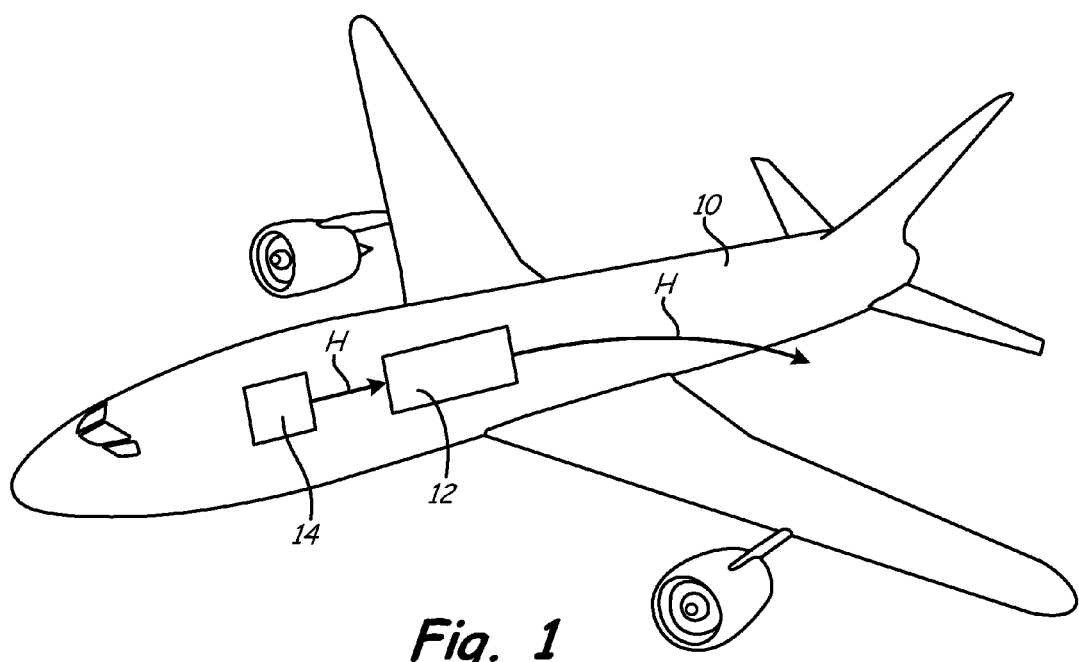
FIG. 1 is a perspective view of an aircraft having a heat management system for an electronics system in accordance with the present invention.

FIG. 1 is a perspective view of aircraft 10 having heat management system 12 for electronic system 14. In the depicted embodiment, aircraft 10 is a commercial airplane, although other types of airplanes (e.g. private or military), aircrafts (e.g. helicopters), and land vehicles are also possible. Heat management system 12 and electronic system 14 are both located onboard aircraft 10. Electronic system 14 can be any electronic system for aircraft 10 (e.g. flight controls, landing gear, radar, or weapons). Electronic system 14 generates heat load H, which varies between a minimum and a maximum or "peak" load. Heat management system 12 has a heat exchange relationship with electronic system 14 such that heat management system 12 absorbs heat load H from electronic system 14. Heat management system 12 rejects heat load H outside of aircraft 10 via an expendable coolant. Heat management system 12 provides a capacity for cooling heat load H from electronic system 14. The details of heat management system 12 are discussed below with respect to FIGS. 2-7.

Figure 2:
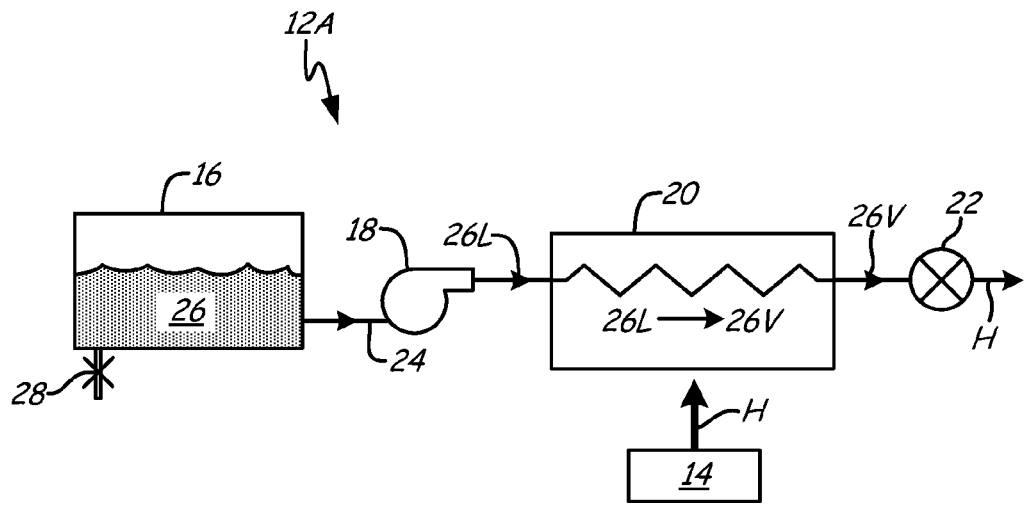
FIG. 2 is a block diagram showing a first embodiment of the heat management system.

FIG. 2 is a block diagram showing a first embodiment of heat management system 12A for absorbing heat load H from electronic system 14. Heat management system 12A includes tank 16, pump 18, heat exchanger 20, and valve 22 located on first conduit 24. Tank 16 includes a volume of coolant 26 and drain 28. Coolant 26 changes state from liquid coolant 26L to vapor coolant 26V as it absorbs heat load H within heat exchanger 20.

Tank 16, pump 18, heat exchanger 20, and valve 22 are located in flow series along first conduit 24. Tank 16 contains and stores a volume of coolant 26 onboard aircraft 10 and therefore, tank 16 acts as a thermal accumulator. Tank 16 can be insulated to prevent coolant 26 from freezing due to cold ambient temperatures either during flight or on the ground. In addition to insulation, tank 16 can also include an electric heating element. If extra cooling capacity is found on aircraft 10, tank 16 can benefit from cooling to reduce the temperature of coolant 26. Drain 28 is included on tank 16 to remove coolant 26 from aircraft 10 during periods of inactivity. In the depicted embodiment, coolant 26 is stored in tank 16 as liquid coolant 26L. Pump 18 is located downstream of tank 16 on first conduit 24 and pumps liquid coolant 26L from tank 16 to heat exchanger 20. If the amount of liquid coolant 26L flowing through first conduit 24 is relatively small, pump 18 can be a vane-type pump. If the amount of liquid coolant 26L flowing through first conduit 24 is relatively large, pump 18 can be a centrifugal-type pump. Heat exchanger 20 is located downstream of pump 18 on first conduit 24 and receives liquid coolant 26L from pump 18.

Liquid coolant 26L enters a first side of heat exchanger 20 in order to absorb heat load H from electronic system 14. Within heat exchanger 20, heat load H is rejected into liquid coolant 26L, which vaporizes and becomes vapor coolant 26V. Vapor coolant 26V, which contains heat load H, exits a second side of heat exchanger 20. Heat load H can be carried from electronic system 14 to heat exchanger 20 by either a liquid (e.g. propylene glycol/water, PAO oil) or a gas (e.g. air). Accordingly, heat exchanger 20 is either a liquid-to-liquid heat exchanger, a liquid-to-gas heat exchanger, or a direct contact heat exchanger. Heat load H can also have indirect thermal contact with heat exchanger 20. In the depicted embodiment, heat exchanger 20 is a boiler, liquid coolant 26L is water, and vapor coolant 26V is steam. Located downstream of heat exchanger 20 on first conduit 24 is valve 22. Valve 22 is an exhaust backpressure valve used to regulate pressure within heat exchanger 20 and thereby, control the temperature of vaporization for coolant 26. If valve 22 is mostly open, vapor coolant 26V is freely vented to the environment outside of aircraft 10. If valve 22 is partially closed, exhaustion of vapor coolant 26V to the environment is reduced and the temperature of vaporization for coolant 26 within heat exchanger 20 is increased. For example, if coolant 26 is water, the boiling point within heat exchanger 20 could be increased from about 212° F. (100° C.) at low altitude to about 300° F. (149° C.). Valve 22, therefore, allows for temperature management of coolant 26 regardless of the altitude of aircraft 10. Coolant 26 absorbs heat load H through latent heat of evaporation, and coolant 26 is expendable in that vapor coolant 26V is rejected to the atmosphere.

Figure 3:
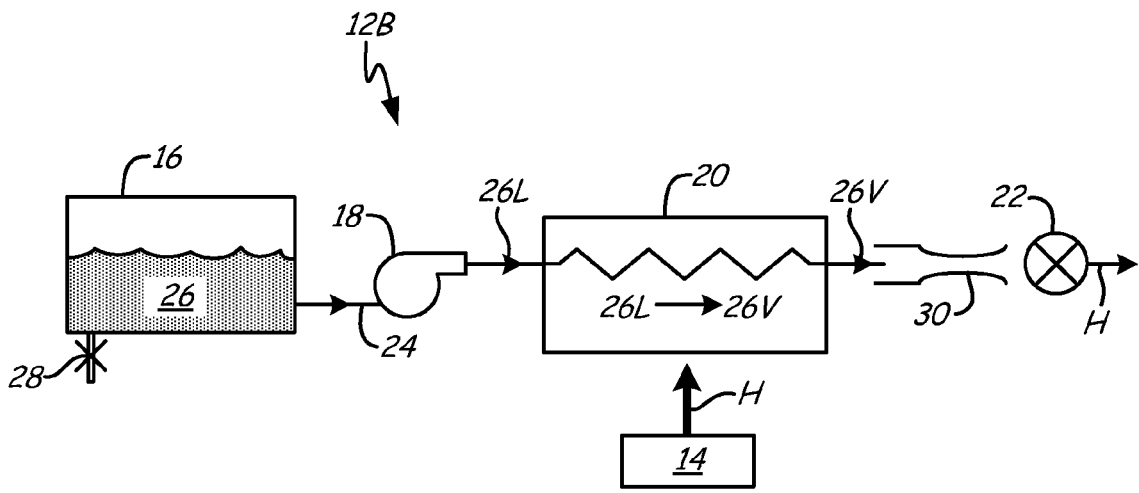
FIG. 3 is a block diagram showing a second embodiment of the heat management system having an ejector.

FIG. 3 is a block diagram showing a second embodiment of heat management system 12B having ejector 30. Heat management system 12B includes tank 16, pump 18, heat exchanger 20, valve 22, and ejector 30 located on first conduit 24. Tank 16 includes a volume of coolant 26 and drain 28. Heat management similar 12B is similar to heat management system 12A described above with reference to FIG. 2, and like reference numerals indicate like components.

As described above, coolant 26 changes state from liquid coolant 26L to vapor coolant 26V as it absorbs heat load H within heat exchanger 20. Ejector 30 is located just downstream of heat exchanger 20 and upstream of valve 22 on first conduit 24. Ejector 30 pumps compressed air (e.g. bleed air from the engine) into first conduit 24 where it mixes with vapor coolant 26V. The injection of compressed air into first conduit 24 reduces pressure within heat exchanger 20 through suction or creation of a partial vacuum. A reduction of pressure within heat exchanger 20 also reduces the temperature of vaporization for coolant 26. For example, if coolant 26 is water, the boiling temperature could be reduced from about 212° F. (100° C.) to as low as 150° F. (66° C.) at low altitude by inclusion of ejector 30 downstream of heat exchanger 20. Accordingly, heat management system 12B allows increased control over coolant 26 temperature regardless of ambient pressure. A mechanical suction pump can be used instead of ejector 30 if energy efficiency takes precedence over weight for aircraft 10.

Figure 4:
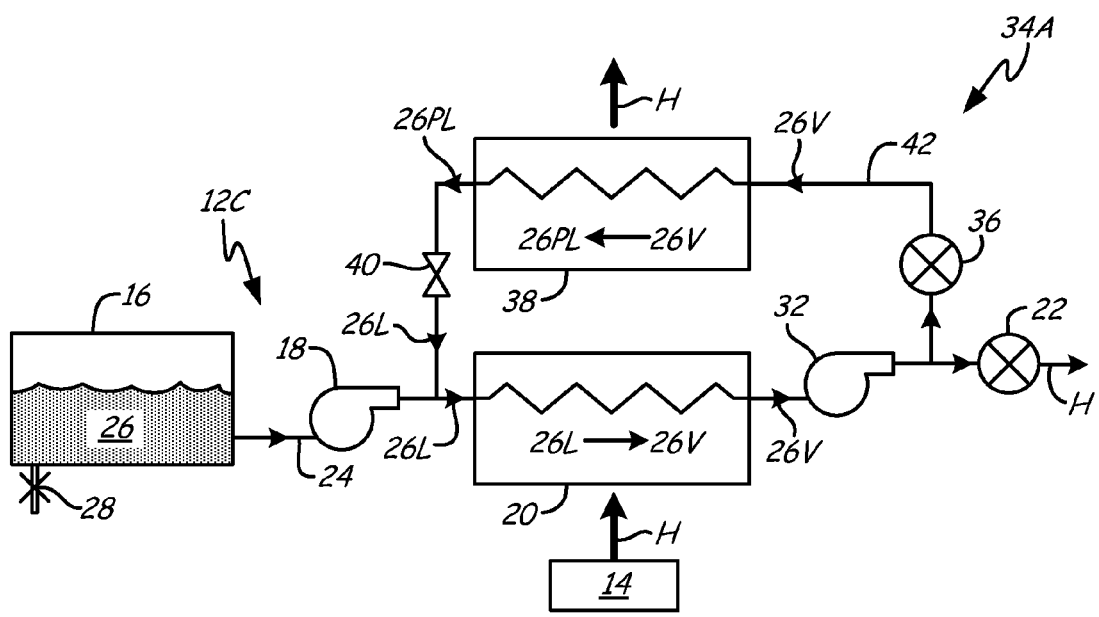
FIG. 4 is a block diagram showing a third embodiment of the heat management system having a compressor and a coolant replenishment system.

FIG. 4 is a block diagram showing a third embodiment of heat management system 12C having compressor 32 and a first embodiment of coolant replenishment system 34A. Heat management system 12C includes tank 16, pump 18, heat exchanger 20, valve 22, and compressor 32 located on first conduit 24. Tank 16 includes a volume of coolant 26 and drain 28. Coolant replenishment system 34A includes shutoff valve 36, condenser 38, and expansion valve 40 located on second conduit 42. Heat management system 12C is similar to heat management system 12B described above with reference to FIG. 3, and like reference numerals indicate like components.

As described above, coolant 26 changes state from liquid coolant 26L to vapor coolant 26V as it absorbs heat load H within heat exchanger 20. Compressor 32 is located just downstream of heat exchanger 20 and upstream of valve 22 on first conduit 24. Compressor 32 functions similarly to ejector 30 described above with reference to FIG. 3. Compressor 32 pumps compressed air into first conduit 24 where it mixes with vapor coolant 26V. The injection of compressed air into first conduit 24 reduces pressure within heat exchanger 20 through suction or creation of a partial vacuum. A reduction in pressure within heat exchanger 20 also reduces the temperature of vaporization for coolant 26. Compressor 32 can be driven by a motor or a turbine (e.g. turbo-compressor) such that the cool air can be used by another subsystem in aircraft 10. A turbine-driven compressor is typically more efficient than an ejector, but is also more expensive, heavier, and assumes a higher volume. An assessment of efficiency versus weight can determine whether heat management system 12B having ejector 30 or heat management system 12C having compressor 32 is a better fit for aircraft 10.

In FIG. 4, heat management system 12C is associated with a first embodiment of coolant replenishment system 34A. Since coolant 26 is expendable, it is advantageous to have a means for generating or recycling coolant 26 onboard aircraft 10. Coolant replenishment system 34A includes shutoff valve 36, condenser 38, and expansion valve 40 located in flow series along second conduit 42. A first end or inlet of second conduit 42 is attached to first conduit 24 at a location between compressor 32 and valve 22. A second end or outlet of second conduit 42 is attached to first conduit 24 at a location between pump 18 and heat exchanger 20.

During periods of peak heat load H from electronic system 14, shutoff valve 36 on second conduit 42 is partially or totally closed such that coolant replenishment system 34A is partially or totally closed off from heat management system 12C. Accordingly, vapor coolant 26V (and heat load H) continues straight from compressor 32 along first conduit 24 and is exhausted through valve 22 to the environment. In other words, coolant 26 is partially or totally expendable during periods of peak heat load H. During period of less than peak heat load H from electronic system 14, shutoff valve 36 is partially or fully open, thereby allowing vapor coolant 26V to flow from heat exchanger 20 into second conduit 42. Second conduit 42 sends vapor coolant 26V to condenser 38. Within condenser 38, vapor coolant 26V is condensed into pressurized liquid coolant 26PL and heat load H is rejected into ram air flow or the fuel system of aircraft 10. Pressurized liquid coolant 26PL exits condenser 38, travels along second conduit 42 and enters expansion valve 40. Within expansion valve 40, pressurized liquid coolant 26PL is expanded into liquid coolant 26L. Depending on temperatures, pressures and the fluid, liquid coolant 26L exiting expansion valve 30 may be combination of vapor and liquid. Liquid coolant 26L then flows from expansion valve 40 along second conduit 42 into first conduit 24. Liquid coolant 26L is introduced back into heat management system 12C upstream of heat exchanger 20. Accordingly, coolant 26 for heat management system 12C is recycled through coolant replenishment system 34A during periods of less than peak heat load H. The addition of coolant replenishment system 34A is advantageous for aircraft 10 where tank 16 cannot provide all coolant 26 necessary for an entire mission.

Figure 5:
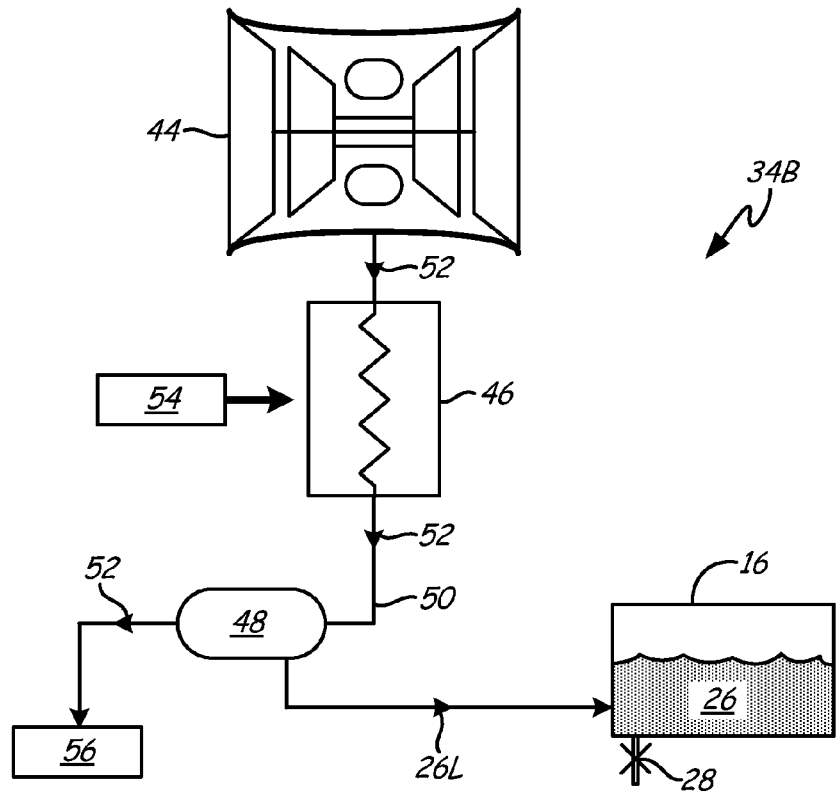
FIGS. 5-7 are block diagrams showing other embodiments of the coolant replenishment system.

FIG. 5 is a block diagram showing coolant replenishment system 34B including engine 44, heat exchanger 46, and water extractor 48 located in flow series on third conduit 50. Also depicted are tank 16, coolant 26, drain 28, bleed air 52, cooling source 54, and ECS 56. In coolant replenishment system 34B, water is extracted from engine 44 bleed air 52 to replenish a volume of coolant 26 in tank 16. Coolant replenishment system 34B is an optional addition to any of heat management systems 12A-12C described above, and is most advantageous at low altitudes and high humidity.

During flight, bleed air 52 is extracted from engine 44 of aircraft 10 and flows into third conduit 50. Bleed air 52 flows along third conduit 50 to heat exchanger 46. Within heat exchanger 46, bleed air 52 rejects heat into (i.e. is cooled by) ram air, cockpit exhaust, or heat load exhaust flowing into heat exchanger 46 from cooling source 54. Cooled bleed air 52 exits heat exchanger 46 and flows along third conduit 50 to water extractor 48. Within water extractor 48, condensation from cooled bleed air 52 is collected and directed to tank 26 as liquid coolant 26L for storage and use in one of heat management systems 12A-12C. Dehumidified bleed air 52 exits water extractor 48 and is directed for use by another system of aircraft 10 that can benefit from reduced humidity bleed air, such as ECS 56. Inclusion of coolant replenishment system 34B on aircraft 10 allows for in-flight replenishment of coolant 26 in tank 16.

Figure 6:
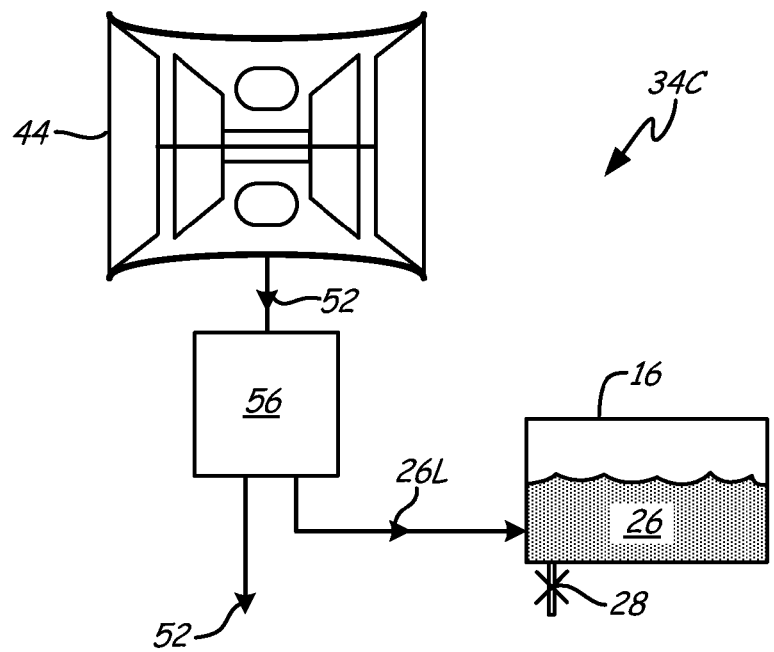

FIG. 6 is a block diagram showing the coolant replenishment system 34C including engine 44 and ECS 56. Also depicted are tank 16, coolant 26, drain 28, and bleed air 52. In coolant replenishment system 34C, water is extracted from ECS 56 to replenish coolant 26 in tank 16. Coolant replenishment system 34C is an optional addition to any of heat management systems 12A-12C.

During flight, bleed air 52 is extracted from engine 44 of aircraft 10 for use by ECS 56. When operating in humid environments, ECS 56 creates excess water, which is commonly sprayed on ECS 56 heat exchangers. Water from ECS 56, however, can be collected and directed into tank 26 as liquid coolant 26L for storage and use by one of heat management systems 12A-12C. Bleed air 52 exits ECS 56 and is directed for use by another system of aircraft 10 that can benefit from reduced humidity bleed air 52 (e.g. cockpit, heat loads). Inclusion of coolant replenishment system 34C on aircraft 10 allows for in-flight replenishment of coolant 26 in tank 16.

Figure 7:
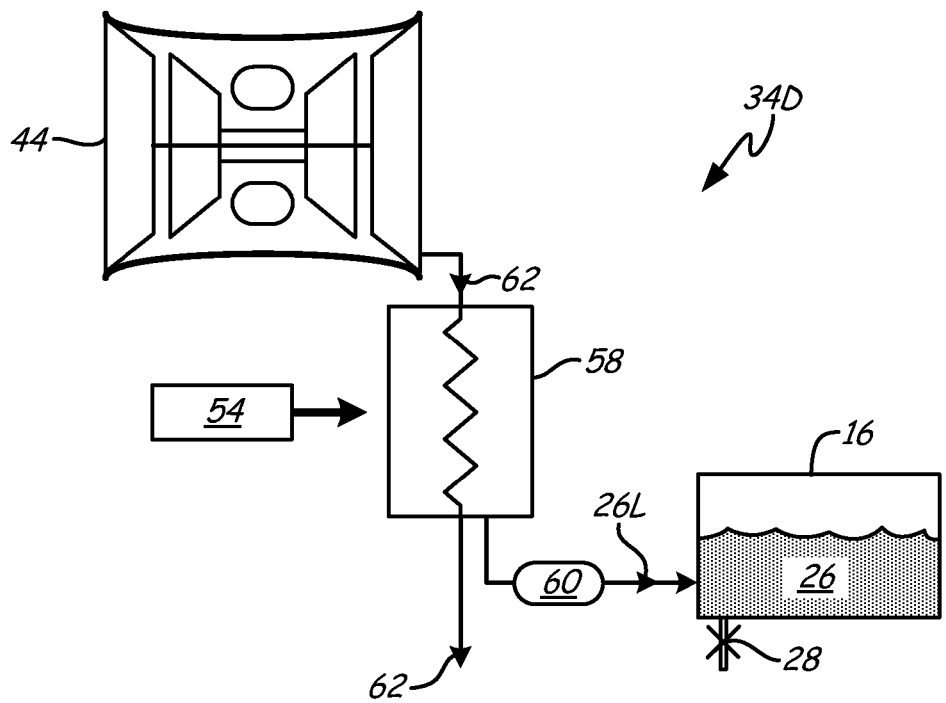

FIG. 7 is a block diagram showing the coolant replenishment system 36D including engine 44, heat exchanger 58, and filter 60. Also depicted are tank 16, coolant 26, drain 28, cooling source 54, and exhaust air 62. In coolant replenishment system 34C, water is extracted from exhaust air 62 of engine 44 to replenish coolant 26 in tank 16. Coolant replenishment system 34D is an optional addition to any of heat management systems 12A-12C.

During flight, core exhaust air 62 is collected from engine 44 after the low pressure turbine. Exhaust air 62 is ducted to heat exchanger 58 for cooling. Within heat exchanger 58, exhaust air 62 rejects heat into (i.e. is cooled by) ram air, or cockpit exhaust, or heat load exhaust supplied from cooling source 54 to heat exchanger 58. While exhaust air 62 is being cooled in heat exchanger 58, water is condensed and extracted from exhaust air 62. The extracted water is sent through filter 60 to remove unwanted combustion byproducts. The filtered water is then sent to tank 16 as liquid coolant 26L for storage and use by one of heat management systems 12A-12C. Dehumidified exhaust air 62 exits heat exchanger 58 and is sent overboard. Inclusion of coolant replenishment system 34D on aircraft 10 allows for in-flight replenishment of coolant 26 in tank 16.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A thermal management system for a vehicle, the system comprising:
 a tank, on board the vehicle, for storing a coolant;
 a heat exchanger, located downstream of the tank on a first conduit, for placing the coolant in a heat exchange relationship with a heat load from the vehicle such that the coolant vaporizes;
 a pump, located between the tank and the heat exchanger on the first conduit, for pumping the coolant from the tank to the heat exchanger;
 a first valve, located downstream of the heat exchanger on the first conduit, for regulating pressure within the heat exchanger and controlling exhaustion of at least a portion of the vaporized coolant from the vehicle;
 a compressor, located between the heat exchanger and the first valve on the first conduit, for reducing pressure within the heat exchanger;
 a condenser for placing a portion of the vaporized coolant in a heat exchange relationship with a cool load from the vehicle to produce condensed coolant;
 an expansion valve for expanding the condensed coolant for combination with the coolant being pumped from the tank to the heat exchanger;
 a second conduit having an inlet and an outlet, the inlet fluidly connected to the first conduit downstream of the heat exchanger and upstream of the first valve, and the outlet fluidly connected to the first conduit downstream of the pump and upstream of the heat exchanger; and
 a second valve, located on the second conduit between the inlet and the condenser, for regulating flow of vaporized coolant to the condenser;
 wherein the second valve is configured to be at least partially open when the vehicle is operating below peak heat load and is configured to be at least partially closed when the vehicle is operating at peak heat load.

2. The thermal management system of claim 1, further comprising:
 a drain connected to the tank for removing the coolant from the tank during periods of inactivity.

3. The thermal management system of claim 1, wherein the compressor is driven by a motor.

4. The thermal management system of claim 1, wherein the compressor is driven by a turbine.

5. The thermal management system of claim 1, and
 wherein the condenser is located on the second conduit; and
 wherein the expansion valve is located on the second conduit between the condenser and the outlet.

6. A method for managing heat for an electronics system onboard an aircraft, the method comprising:
 storing a liquid coolant in a tank on the aircraft;
 pumping the liquid coolant to a heat exchanger with a pump;
 vaporizing the liquid coolant into a gas coolant in the heat exchanger by absorbing a heat load from the electronics system;
 reducing pressure within the heat exchanger using a compressor;
 exhausting at least a portion of the gas coolant from the aircraft during a period of peak heat load;

condensing a portion of the gas coolant into a high pressure liquid coolant during a period of less than peak heat load; and expanding the high pressure liquid coolant for combination, at a location downstream of the pump and upstream of the heat exchanger, with the liquid coolant being pumped to the heat exchanger during a period of less than peak heat load.

7. The method of claim 6, further comprising:

modulating the exhaust to acquire a desired temperature of vaporization within the heat exchanger.

8. The method of claim 6, further comprising:

draining the coolant from the tank during periods of inactivity.

9. The method of claim 6, further comprising:

replenishing the liquid coolant on the aircraft by extracting water from an environmental control system, engine bleed air, or engine exhaust.

10. A thermal management system for an electronics system in an aircraft, the system comprising:

a tank for storing water onboard the aircraft;

a boiler for placing the water in a heat exchange relationship with a heat load from the electronics system such that the water vaporizes into steam;

a pump for pumping the water from the tank to the boiler;

a compressor for injecting air into the steam, thereby reducing pressure within the boiler;

a backpressure valve for regulating pressure within the boiler and controlling exhaustion of at least a portion of the steam from the aircraft;

a condenser for condensing a portion of the steam into high pressure water;

an expansion valve for expanding the high pressure water for combination with the water being pumped from the tank to the boiler at a location downstream of the pump and upstream of the boiler; and a condenser shutoff valve for modulating steam entering the condenser;

wherein the condenser shutoff valve is configured to be at least partially open when the vehicle is operating below peak heat load and is configured to be at least partially closed when the vehicle is operating at peak heat load.

11. The thermal management system of claim 10, further comprising:

a drain connected to the tank for removing the water from the tank during periods of inactivity.

12. The thermal management system of claim 10, wherein the water is replenished by extracting water vapor from engine exhaust.

* * * * *